United States Patent
Kik

(10) Patent No.: US 9,748,416 B2
(45) Date of Patent: Aug. 29, 2017

(54) OPTICAL DETECTOR APPARATUS, METHOD, AND APPLICATIONS

(71) Applicant: University of Central Florida Research Foundation, Inc., Orlando, FL (US)

(72) Inventor: Pieter G. Kik, Orlando, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 0 days.

(21) Appl. No.: 14/807,934

(22) Filed: Jul. 24, 2015

(65) Prior Publication Data
US 2015/0340523 A1    Nov. 26, 2015

Related U.S. Application Data

(63) Continuation of application No. 14/227,282, filed on Mar. 27, 2014, now abandoned.

(60) Provisional application No. 61/805,689, filed on Mar. 27, 2013, provisional application No. 61/835,178, filed on Jun. 14, 2013.

(51) Int. Cl.
| | |
|---|---|
| *H01L 31/052* | (2014.01) |
| *B05D 5/12* | (2006.01) |
| *G02F 1/01* | (2006.01) |
| *H01L 31/0232* | (2014.01) |
| *H01L 35/30* | (2006.01) |
| *H01L 31/0224* | (2006.01) |
| *H01L 31/0216* | (2014.01) |

(52) U.S. Cl.
CPC ........... *H01L 31/022408* (2013.01); *H01L 31/02161* (2013.01); *H01L 31/02327* (2013.01)

(58) Field of Classification Search
CPC ....... H01L 31/022408; H01L 31/02161; H01L 31/02327
See application file for complete search history.

(56) References Cited

U.S. PATENT DOCUMENTS

| | | | | |
|---|---|---|---|---|
| 8,053,662 | B2* | 11/2011 | Khazeni | F24J 2/08 136/244 |
| 2007/0125415 | A1* | 6/2007 | Sachs | H01L 31/0508 136/205 |
| 2008/0278796 | A1* | 11/2008 | Roosendaal | G02F 1/133553 359/296 |
| 2009/0178704 | A1* | 7/2009 | Kalejs | B32B 17/10743 136/246 |
| 2009/0255569 | A1* | 10/2009 | Sampsell | H01L 31/022425 136/246 |
| 2012/0135512 | A1* | 5/2012 | Vasylyev | G02B 19/0028 435/292.1 |

(Continued)

*Primary Examiner* — Marcos D Pizarro Crespo
*Assistant Examiner* — Nelson Garces
(74) *Attorney, Agent, or Firm* — Bond, Schoeneck & King, PLLC; William Greener

(57) ABSTRACT

An optical device including a shaped electrode on a substrate thereof utilizes total internal reflection to provide improved transmission of electromagnetic radiation ('light') to the substrate compared to standard electrode designs that involve flat electrode surfaces. Redirection of incident light by a tilted or otherwise shaped contact or material added on the contact provides otherwise reflected light to an open surface region of the substrate. Optional plasmon mediated focusing of incident p-polarized light may be realized.

12 Claims, 8 Drawing Sheets

(56) References Cited

U.S. PATENT DOCUMENTS

2015/0207006 A1* 7/2015 Fesquet .............. H01L 31/0547
136/256

* cited by examiner

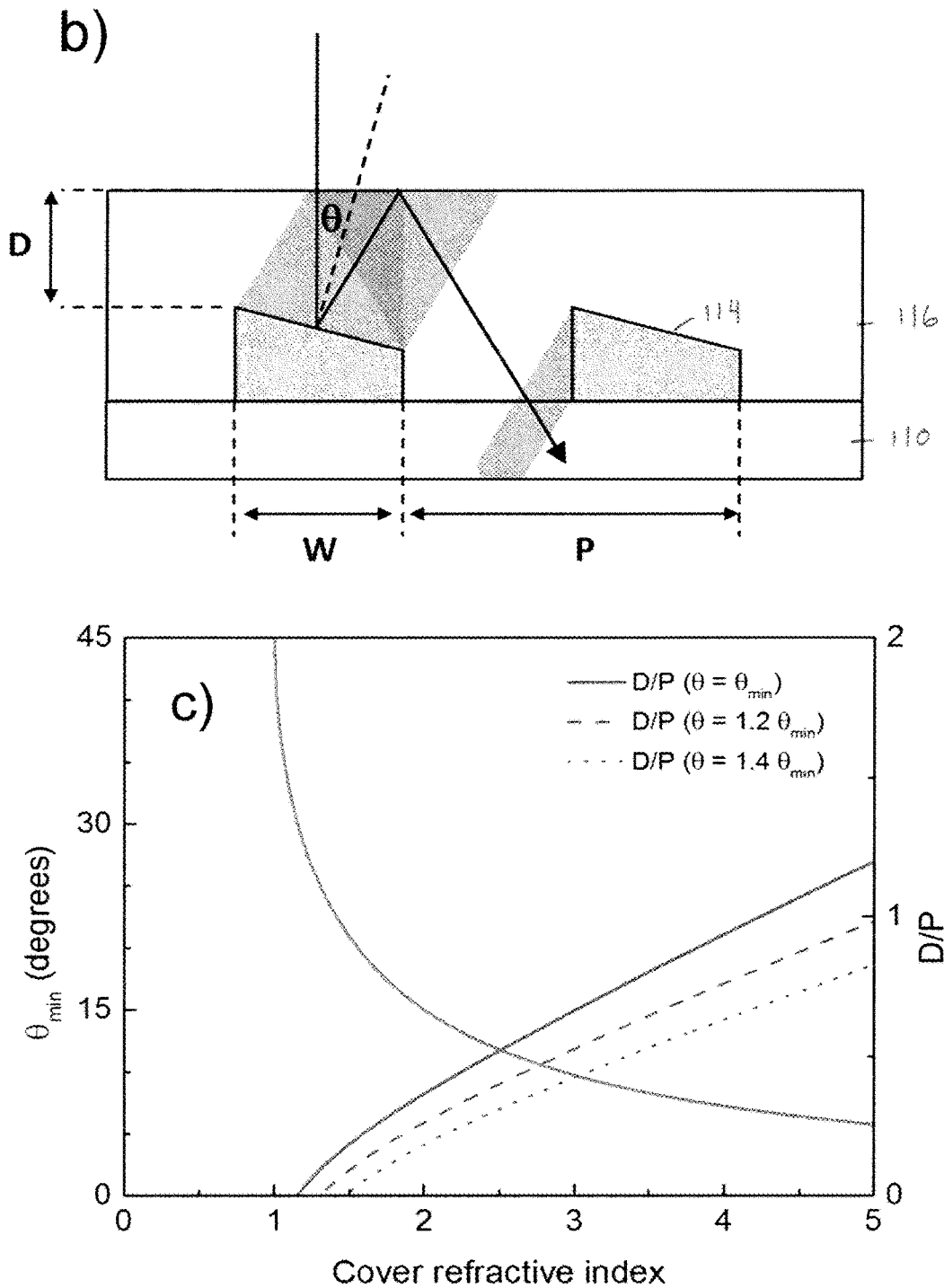
FIG. 4 (con't.)

a)

b)

OPTICAL DETECTOR APPARATUS, METHOD, AND APPLICATIONS

RELATED APPLICATION DATA

The instant application is a continuing application of application Ser. No. 14/227,282 filed Mar. 27, 2014 and claims priority to U.S. provisional application Ser. Nos. 61/805,689 filed Mar. 27, 2013 and 61/835,178 filed Jun. 14, 2013, the subject matters of which are incorporated herein by reference in their entireties.

BACKGROUND

Aspects and embodiments of the invention are most generally directed to solid state optical devices, optical modulation devices, optical power conversion devices, optoelectronic conversion devices (including photovoltaic (PV) devices), and other optical devices that require both high optical transmission to and/or into an active region of the device, and electrical access, and most generally to any optical structure that makes use of electrodes in the optical path (all referred to hereinafter as 'optical devices); more particularly, to optical devices having modified electrode characteristics and associated methods for increasing and/or optimizing the amount of light reaching an active region of the device where the light may be at least partially or completely absorbed, modulated, or at least partially transmitted, and applications thereof. The term 'active region' here signifies (or could, for example) a region of the device where light, possibly in combination with other factors (chemical, physical), can induce an electrically observable response, or where an applied electrical signal (voltage or current), possibly in combination with other factors (chemical physical), can induce a desired optical response. For example, getting light to the gap between electrode lines is advantageous for a modulator (for switching applications; absorbing light over some depth into the substrate beyond the electrodes is advantageous for optical detection). Apparatus and methods involving a wide range of electrode gaps and electrode sizes and enabling light transmission at frequencies ranging from the ultraviolet (UV) region through the infrared (IR) region are embodied by the invention.

In a broad variety of optical devices, incident radiation induces an electrical response, e.g., generating a current as the signal, a change in conductivity, or a change in current or, vice-versa; i.e., an electrical current or voltage changes the optical response. To detect or induce these responses, conductive contact materials may to be present. FIG. 1 shows a cross-section of a generic electrically addressable optical device, specifically a generic optical detector. Light (arrows A) is incident on the optical detector material (C) where it is at least partially transmitted and/or absorbed. This generic detector material may represent a wide variety of materials and structures, including but not limited to inorganic and organic semiconductors, semiconductor superlattices, semiconductors with embedded quantum dots, etc. An electrode (B) is present that can detect changes in electrical response. The electrode extends out of the plane of the figure and reaches an electrical circuit used for signal detection. A counter-electrode is present elsewhere on the device, typically at the bottom of the device or to the side of contact B. Contact B typically reflects and absorbs a significant fraction of the incident light, resulting in a shadowed region (D) and consequently a reduction in the amount of light that interacts with the detector material (C).

FIG. 2 shows a similar optical detector, where the presence of a positive electrode (B) and a negative electrode (E) is explicitly shown. The open detector area between the two electrodes is reduced compared to the total detector surface area, resulting in loss of detectable signal in the detection region C. The physical properties of the materials used and application-dependent technical requirements in some cases result in a relatively small fraction of open detector area, leading to large shadowing losses as shown at D and E. The embodied invention, in various aspects, reduces these losses and enables relatively more incident light to reach the light detection region of the device (e.g., substrate or active region of the substrate).

Several approaches to mitigate these shadowing effects, generally referred to as 'transparent electrode' structures, have been considered, including the use of transparent conductive oxides and periodically patterned electrodes resulting in plasmon enhanced extraordinary transmission. Transparent conductive oxides introduce appreciable optical absorption, and have conductivity values substantially less than metallic top contacts, respectively limiting device responsivity and device operation speeds. Periodically patterned electrodes that achieve optical transparency with the assistance of surface plasmons rely on interference effects, making them inherently narrowband and angle-dependent. Additionally they require micro-scale patterning.

In view of the shortcomings, challenges, and problems appreciated in the art, the inventor has recognized the benefits and advantages provided by one or more of the following attributes provided by the embodied invention:

improved transmission of light beyond the electrical contacts and reaching an active region of the device in optical devices that require electrical contacts on a top surface, resulting in better device performance;

no required patterning of the device material itself, avoiding deterioration of its physical, optical, and electronic properties;

no required regular electrode placement for electrodes much larger than the optical wavelength;

can be used for straight and curved electrodes;

no strong polarization dependence;

operable over a broad range of wavelengths (UV through IR);

compatible with common interdigitated electrode layouts;

used to potentially increase the amount of electrode material used with relatively little loss in light transmission, allowing low electrode resistance and potential or realized faster and more efficient (less resistive loss) device performance;

for small (diffraction regime) electrodes, makes use of surface plasmons on the electrode surfaces to further concentrate optical energy near the electrode gap;

for small electrodes and small electrode spacing, additional optimization of light redirection can be achieved by making use of diffractive effects caused by regular electrode placement.

Definitions of Terms as Used Herein

The term 'light' means electromagnetic radiation covering the UV through IR spectra as may be detected, modulated, or transmitted by an optical device (e.g., detector) as known in the art.

The term 'optical device' is used herein to refer to any solid state optical device that requires electrical contacts in the optical path, including but not limited to, optical detectors, optical modulation devices, optical power conversion devices, and optoelectronic conversion devices (including PV), and other devices that require both high transmission of incident light to and/or beyond the electrode gap (i.e., into the active region of the device substrate), and electrical access.

The term 'surface-shaped electrode' means an electrode having a light-receiving surface that is characterized by a particular shape, orientation, patterning, and/or optical characteristic that affects the incident light in a predetermined manner; e.g., reflects at least part of the incident light at a desired angle to effect a further desired response; e.g., total internal reflection (TIR) in an environment around the electrode.

The term 'substrate' means the portion of the optical device to which the electrode is coupled, and which is or contains the optically active or responsive region of the device (e.g., a silicon wafer with an electro-optic (e.g., voltage dependent transmission) material; which light must reach for subsequent absorption, conversion, transmission, or modulation).

The term 'tilted' as it may refer to the inclination of a surface-shaped is not limited to mathematically perfect inclination of the electrode surface; rather, a surface that is, e.g., stepped in appropriately sized steps will also be considered a tilted surface.

The term 'about' means the amount of the specified quantity plus/minus a fractional amount (e.g., ±10%, ±9%, ±8%, ±7%, ±6%, ±5%, ±4%, ±3%, ±2%, ±1%, etc.) thereof that a person skilled in the art would recognize as typical and reasonable for that particular quantity or measurement.

The term 'substantially' means as close to or similar to the specified term being modified as a person skilled in the art would recognize as typical and reasonable; for e.g., within typical manufacturing and/or assembly tolerances, as opposed to being intentionally different by design and implementation or. For example, 'light substantially only in the visible spectrum' as may be used herein means 'light only in the visible spectrum' to the degree available by appropriate optical filters or other mechanisms intended to allow only visible light and to exclude light in non-visible spectra.

SUMMARY

An aspect of the invention is an optical device including an electrode, having a structure that enables a relatively greater amount of incident light to reach a light detection or light-responsive region of the device (i.e., substrate or active region/layer of the substrate). According to an embodiment, the optical device includes a substrate including an active layer/region that is reachable by the light, having a refractive index greater than 1; an electrode operatively coupled to the substrate, wherein said electrode has a light-receiving surface that is characterized by a given shape and/or a given optical characteristic; and a cover layer covering at least a portion of the top surface of the substrate including the electrode, and within which cover layer the electrode is disposed, wherein the given shape and/or the given optical characteristic of the light-receiving surface is adapted such that light incident on the light-receiving surface will be reflected there from at an angle, θ, where θ will be sufficient for total internal reflection (TIR) of light from a top surface of the cover layer and to the detection region of the device. According to various exemplary, non-limiting embodiments, the device may include the following additional features, limitations, and/or characteristics, alone or in various combinations as one skilled in the art would understand:

wherein the cover layer is approximately index-matched with the substrate;
wherein the cover layer has a different index of refraction than the substrate;
further comprising an anti-reflection coating disposed on or adjacent a surface of the substrate;
wherein the light-receiving surface of the electrode is flat and angled in at least one direction with respect to the top surface of the substrate;
wherein the light-receiving surface of the electrode is curved;
wherein the light-receiving surface of the electrode is flat and parallel to the top surface of the substrate and is covered with a material of at least one of characterized by a gradient index of refraction and a varying physical thickness to achieve light redirection to large angles;
wherein the electrode comprises a plurality of periodically spaced electrodes;
wherein the active layer comprises a surface of the substrate;
wherein the active layer comprises an interior region of the substrate;
wherein the substrate is at least partially optically transmissive and/or absorptive.

An aspect of the invention is a method for improving the operation of an optical device.

According to an embodiment, a method includes the steps of providing an optical device including: a substrate including an active layer/region that is reachable by the light, having a refractive index greater than 1; an electrode in operative contact with the substrate, wherein said electrode has a light-receiving surface that is characterized by a given shape and/or a given optical characteristic; and a cover layer covering at least a portion of the top surface of the substrate including the electrode, and within which cover layer the electrode is disposed, wherein the given shape and/or the given optical characteristic of the light-receiving surface is adapted such that light incident on the light-receiving surface will be reflected there from at an angle, θ, where θ will be sufficient for total internal reflection (TIR) of light from a top surface of the cover layer above the light-receiving surface of the electrode and to an active region of the device; exposing the optical device to incident light that reaches the light-receiving surface of the electrode and reflects therefrom at the angle, θ; totally internally reflecting the light within the cover layer; and propagating the light through the cover layer to the light detection/light-sensitive region of the device, wherein the substrate is at least partially optically transmissive and/or absorptive or the active layer comprises a surface of the substrate.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

DETAILED DESCRIPTION OF NON-LIMITING, EXEMPLARY EMBODIMENTS

An embodiment of the invention is an optical device having a shaped-surface electrode. The embodied optical device enables enhanced transmission (i.e., relatively greater amount) of incident light to reach a specific, desired region (e.g., active region) of the device and thus provide improved device performance over optical devices having traditional electrode designs that involve flat electrode surfaces aligned with the substrate surface to which they are attached, and which require at least one electrode to overlay the illuminated detection (substrate) surface.

Figure 1:
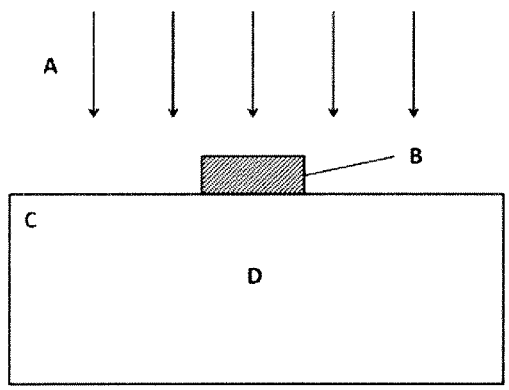
FIG. 1 schematically shows in cross section a conventional optical detector with an electrode as known in the art.
Figure 2:
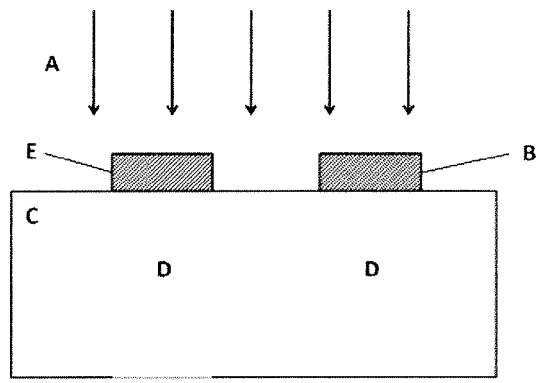
FIG. 2 schematically shows in cross section another conventional optical detector electrode layout as known in the art.
Figure 3:
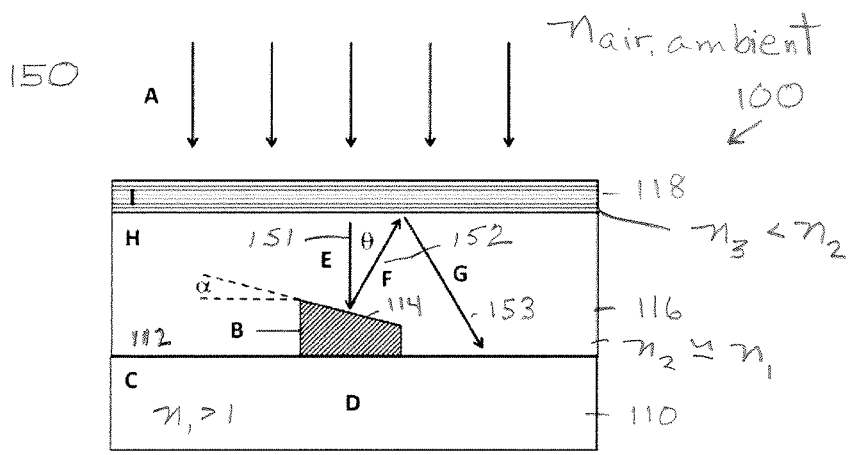
FIG. 3 schematically shows in cross section an optical device having a shaped-surface electrode, according to an illustrative embodiment of the invention.
Figure 9:
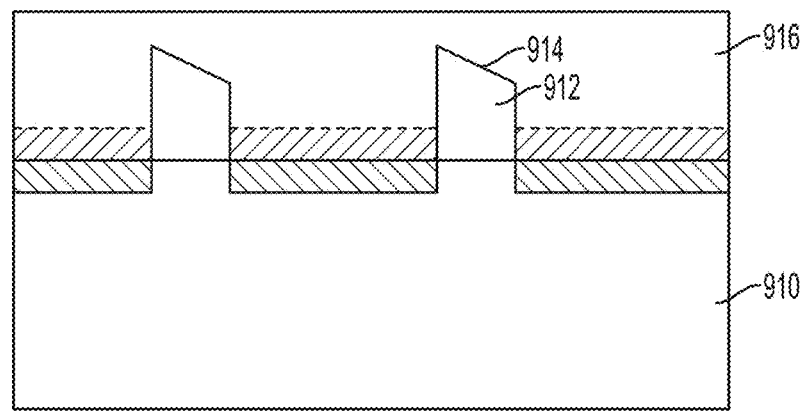
FIG. 9 shows a schematic cross section of a device including an anti-reflection layer at the cover layer/substrate interface on the interface surface of the substrate and, alternatively, in the interface surface of the substrate, according to illustrative aspects of the invention.

FIG. 3 generically illustrates basic principles and features of an embodied optical device 100. The optical device 100 includes a substrate (detector material) 110 characterized by a refractive index, $n_1$, greater than 1, an electrode 112 having a shaped, patterned, or angled top, light-receiving surface 114, a cover layer 116 within which the electrode is disposed, characterized by a refractive index, $n_2$, that may be approximately or substantially equal to $n_1$ such that the cover layer can be considered to be index-matched with the substrate for light transmission there through (as discussed below, if the cover layer is not index-matched, an AR coating may be defined in the electrode gap), and an optional anti-reflection (AR) coating 118 characterized by a refractive index, $n_3$, that is less than $n_2$ and the index, $n_{Ambient}$ of the outside ambient environment (e.g., gaseous, aqueous, etc.). FIG. 9 shows a schematic cross section of a device including an anti-reflection layer at the cover layer/substrate interface, advantageous when the cover layer is not substantially index-matched to the substrate. Note that FIG. 9 shows both an AR coating on the substrate surface interface and also, alternatively, in the substrate immediately adjacent the surface interface. This anti-reflection layer aspect may be achieved using layer deposition, partial oxidation of the substrate, partial etching resulting in a desired effective medium refractive index, etc.

Referring again to FIG. 3, functionally, as enabled by its construction, incident radiation 150 passes through an anti-reflection layer 118 with minimal reflection loss. Consequently, since the cover layer 116 is index-matched to the substrate 110, the cover layer-transmitted radiation enters the detector material with minimal reflection loss. Some of the incident transmitted light 151 strikes the tilted electrode surface 114 that is tilted at angle α, resulting in a redirection of the light 152 at an angle θ back towards the AR coating layer 118. The reflected light 152 propagates at the angle θ whose value is greater than the angle $\theta_{TIR}$ for total internal reflection (TIR) from the AR layer/cover layer interface; the TIR light is shown as 153. The angle for TIR depends on the index of refraction of the cover layer as well as on the refractive index of the operating ambient, but not on the index of the anti-reflection layer. The reflected light 152 may partly enter into the anti-reflection coating but cannot exit the structure due to TIR. This results in reflected light 153 traveling towards the substrate (detector material). Since the cover layer and the substrate are (at least approximately) index-matched, the reflected light will propagate to the substrate with minimal reflection losses. By optimizing the thickness of the cover layer a relatively larger fraction of the light initially reflected by the electrode will reach the substrate where it can contribute to improved device performance.

It will be appreciated that in the case of the device being a modulator, the electrode voltage could, e.g., switch absorption on and off (switchable window), switch scattering on and off (e-ink applications), switch reflection on and off, and/or change molecular orientation (liquid crystal display).

If a suitable index-matched cover layer is not available, an AR coating can be applied at the cover layer/substrate interface.

It is to be noted that while in the example of FIG. 3 a fixed tilt angle of the electrode light-receiving surface 114 is shown, the electrode surface could contain multiple tilted (right or left) sections at sufficiently large angles for the embodied functionality. Further, the electrode surfaces could be curved to improve light direction toward the electrode gap.

If the technical requirements necessitate the use of electrodes with a composition that results in low reflectance, e.g., to obtain a certain desired electronic band offset, to satisfy thermal stability requirements, or to avoid interdiffusion of the metal with the substrate, the electrode may be coated with a more reflective metal or an artificial dielectric structure (multilayer, photonic crystal, effective medium) optimized for higher reflectance.

It is to be further appreciated that an improved device response may be realized even in the absence of anti-reflection layer 118, and even if layers 110 and 116 are not sufficiently index-matched. If cover layer 116 and substrate 110 cannot be index-matched, an additional anti-reflection layer (not shown) may be placed at the cover layer/substrate interface in the open detector area to minimize reflection losses. Furthermore, all layers could be replaced by effective media having the desired effective refractive indices as achieved by nanostructuring (e.g., applying patterns of nanoholes, nanolamellae, adding well-dispersed, high-index nanoparticles, etc.). Anisotropic materials or effective media may be included to optimize polarization-dependent performance without changing the basic operating principle of the invention.

Figure 4:
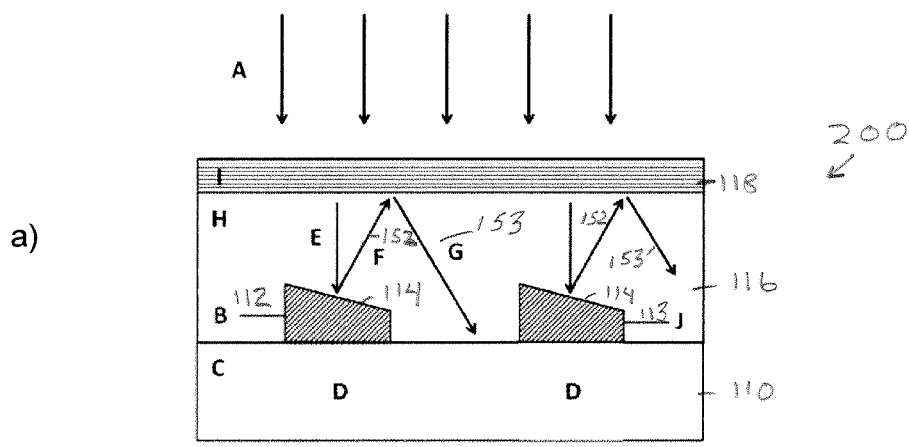
FIG. 4: a) schematically shows in cross section an optical device having a plurality of shaped-surface electrodes, according to an illustrative embodiment of the invention; b) schematically illustrates the path of a light beam incident entirely on the left electrode for a case where optical transmission through the cover layer and to the detection region of the device=100% based on device and electrode parameters, according to an exemplary embodiment of the invention; c) a graph that shows the minimum allowed electrode tilt angle $\theta_{min} = \theta_{TIR/2}$ (TIR) as a function of cover refractive index. The corresponding required cover layer thickness D above the average electrode height for achieving 100% transmission to the substrate at a given electrode line spacing P is included (solid line) expressed in relative units D/P, according to an illustrative aspect of the invention.

FIG. 4a shows an optical device 200 similar to optical device 100 but having multiple electrodes that each partially obstructs the open detection area (e.g., the use of interdigitated electrodes in typical metal-semiconductor-metal detector designs). In the example shown in FIG. 4a, a positive electrode 112 and a negative electrode 113 are present. The operating principle here is similar to that shown and described for the embodiment of FIG. 3. What is different is that the thickness of the cover layer 116 is optimized to ensure that a larger fraction of the reflected light 153 will reach an open detection region. The top surfaces 114 of electrodes 112, 113 may be shaped, curved, and/or covered with varying amounts of refractive material, or otherwise modified to maximize the fraction of reflected light reaching the active region of the device.

Although not illustrated, the corners of the electrodes may be rounded, truncated, or otherwise modified to minimize scattering losses that could result in light leakage in the upward direction.

The amount of metal (electrode surface) and its distribution across the detector surface will be determined by the application and, consequently, the application may put constraints on the allowable minimum thickness of specific parts of the electrode. The exact implementation of the embodied invention can be adapted to those specific technical requirements, e.g., by changing the average height of the electrodes. It should be noted that although vertical sidewalls are shown in the electrode examples, sidewall shaping or tilting may be used to further optimize transmission, modulation, or detection performance, including angular distribution of the transmitted light.

FIGS. 4b, c illustrate an example of conditions that allow enhanced transmission of light to the detection region in the fixed-tilt electrode surface approach. FIG. 4b shows an example structure 200 (similar to that in FIG. 4a) including two electrodes each having a width W, a periodicity P, and a distance D from the top of the electrode surface to the top of the cover layer 116. The cover layer is assumed to be anti-reflection coated as described above. A ray tracing analysis shows that at 50% metal coverage (W=0.5 P), 100% transmission can be achieved when $D=\frac{1}{4}(\cot(2\theta)-\tan(\theta)) \times P$, where $\theta$ should exceed $\theta_{TIR/2}$ where $\theta_{TIR}$ is the internal angle required for total internal reflection in the cover layer. FIG. 4b includes the path of a light beam incident entirely on the left electrode for a case where T=100% by choosing $\theta=15°$ and D=0.366P. This requires a cover layer index $n_2 \geq 2$ to achieve TIR at the reflected angle of 30°. Note that the entire beam incident onto the metal electrode reaches the substrate after a maximum of three reflections.

FIG. 4c shows the minimum allowed electrode tilt angle $\theta_{min}=\theta_{TIR/2}$ (TIR) as a function of cover layer refractive index $n_2$. The corresponding required cover layer thickness for achieving 100% transmission to the substrate is shown as solid line 401 and is expressed in relative units D/P. For common refractive index values between 1.5-4, complete transmission can be achieved with cover layer thickness values less than the electrode spacing. Similar results are obtained when the electrode tilt is $1.2 \times \theta_{min}$ (dashed line) and $1.4 \times \theta_{min}$ (dotted line). The embodied approach can be scaled virtually arbitrarily, within angular limits set by the refractive index of the substrate and cover layer, and is not intrinsically wavelength or polarization dependent. It is to be understood that the electrodes may be narrower than the gap. For electrodes that are wider than the gap, a curved electrode surface may be advantageous.

The light redirection afforded by the embodied invention can be achieved in different ways, and the examples illustrated thus far do not represent exhaustive implementations of the invention.

Figure 5:
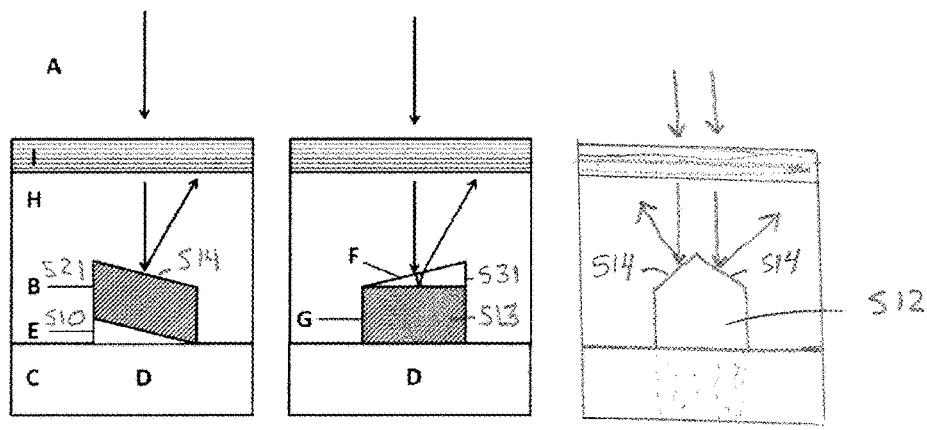
FIG. 5 (left, center, right) shows three alternative shaped-surface electrode designs for the desired manipulation of incident light, according to illustrative aspects of the invention.

FIG. 5 shows (left, center, and right) three different, alternative example implementations; however, still other common methods/structures for redirecting light may be implemented as well. In the left example in FIG. 5, a tilted electrode top, light-receiving surface 514 is achieved by depositing a selected material 521 onto a previously applied surface feature 510 having a tilted top surface as shown. In this case the addition of a constant-thickness metal (521) onto this tilted feature results in a tilted top surface (514), enabling the required light redirection.

An alternate approach is shown in the center example of FIG. 5. In this case a refractive optical layer 531 having varying physical thickness (e.g., wedge) is applied onto the surface of a flat electrode top surface 513. Refraction in the dielectric layer 531 can lead to the desired high-angle refraction, followed by total internal reflection at the AR coating/cover layer interface.

FIG. 5 (right) illustrates an electrode having multiple tilted surfaces in different directions, which improves angular response.

Figure 10:
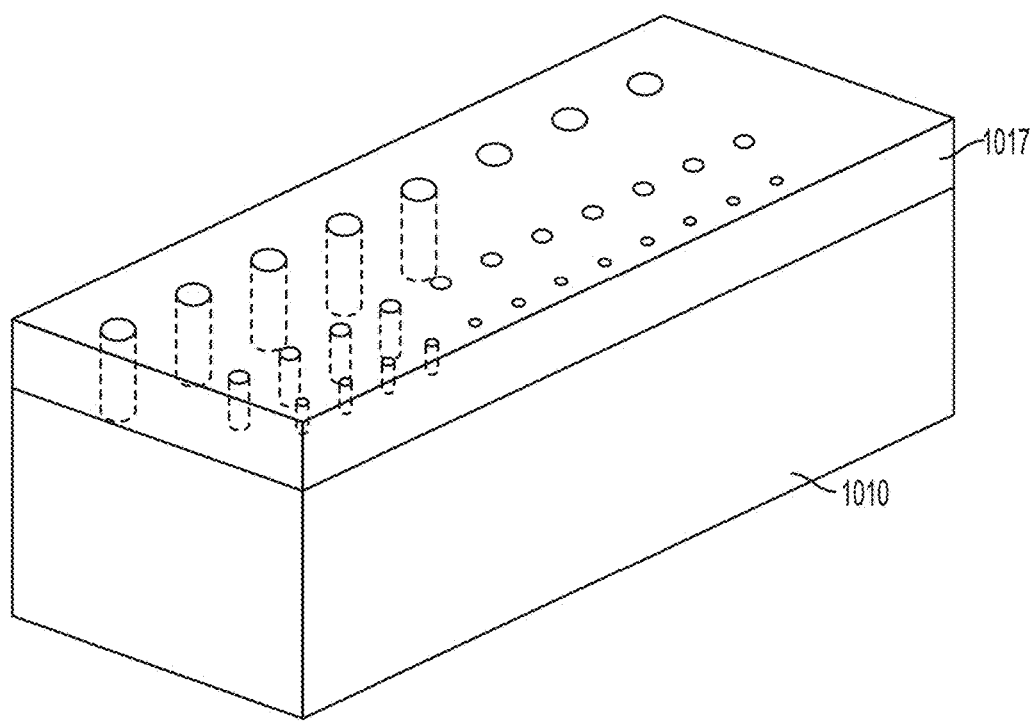
FIG. 10 schematically illustrates the use of an effective medium approach to change the light direction in the device, allowing for planar patterning methods, according to an illustrative aspect of the invention.

An effective optical redirection can also be achieved if the added optical layer 531 has a varying refractive index (e.g., gradient) across its surface, leading to a laterally varying optical thickness as opposed to a physical thickness, as illustrated in FIG. 10. FIG. 10 shows a section of an electrode with an added layer of an effective index material 1017 in which columns of thru-holes of varying diameter are provided in the added layer to provide an index gradient along the electrode top. The cover layer providing the TIR angle has been omitted from this schematic drawing for clarity.

Small Electrode Spacing

For certain applications it may be advantageous or necessary to provide optical devices with small electrode spacing, e.g., spacing limited by carrier diffusion length. Electrode gaps as small as 1 μm or less may be encountered. Depending on the light wavelength to be detected, the electrode size and spacing may approach the optical wavelength. Under these conditions the optical ray interpretation shown in FIGS. 3-5 may not be appropriate and care should be taken that the generated reflected light reaches the open detection region when taking into account diffractive effects. In addition, conductive electrode materials support coupled surface electromagnetic/charge density waves known as surface plasmons, which affect the light distribution in the structure. This effect can be used to further optimize light transmission and device performance.

Embodiments of the invention further utilize the combination of the general principle of light redirection to an angle beyond the angle for TIR with the optimization of the light distribution by modifying the electrode periodicity (leveraging diffractive effects), as well as an implementation in which the electrode shape and spacing are modified in order to also utilize surface plasmons for additional concentration of light in the open detection area near the electrodes and the enhanced absorption of radiation in the open detection area.

Figure 6:
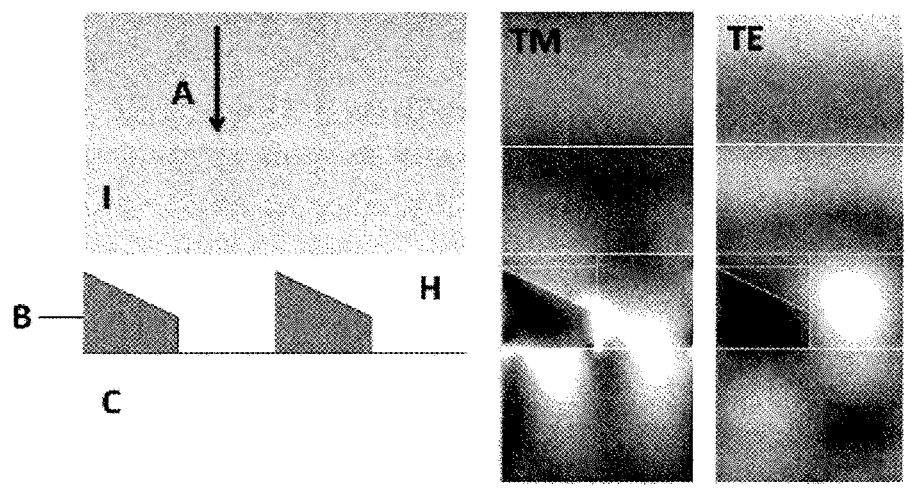
FIG. 6 illustrates an optical device designed to have small inter-electrode spacing, according to an illustrative aspect of the invention.

FIG. 6 shows an example of a device structure designed to have small inter-electrode spacing. The left panel shows the structure, indicating the incident light 650, which can be TE or TM polarized, a surface-shaped electrode 612, a substrate (detector material) 610, a cover layer 616, and an anti-reflection coating 618. In this exemplary illustration, the electrode is assumed to be made out of aluminum, the detector material is assumed to have a dielectric constant (relative permittivity) of 3.4, the cover layer is assumed to have a near-identical dielectric constant of 3.3, the anti-reflection coating is assumed to have a dielectric constant of 2. The thickness of AR layer 618 is 80 nm, the thickness of cover layer 616 is 70 nm, the repeat-distance of the electrodes is 140 nm, the maximum height of the electrodes is assumed to be 60 nm, the width of the electrodes is 70 nm, and the tilt of the electrodes is −0.45 radians. These parameters are not fully optimized for maximum transmission, but are sufficient to demonstrate the main results.

The middle panel of FIG. 6 shows the distribution of the magnitude of the electric field under TM illumination (electric field parallel to the page), and thus give a representation of light intensity, calculated for an incident light wavelength of 270 nm. Note that the light is concentrated around the electrode, with the amplitude in substrate layer 610 clearly exceeding the maximum amplitude of the incident light. The bright regions on the electrode surface are the result of plasmon oscillations on the Al surface. Structural parameters can be optimized to generate maximum field amplitude in the electrode gap. The right panel shows the same calculation under TE excitation (electric field normal to the page). Note that the metal electrode focuses the incident light in the gap region between the electrodes. Further parameter optimization can be used to move the exact location of this field maximum.

Figure 7:
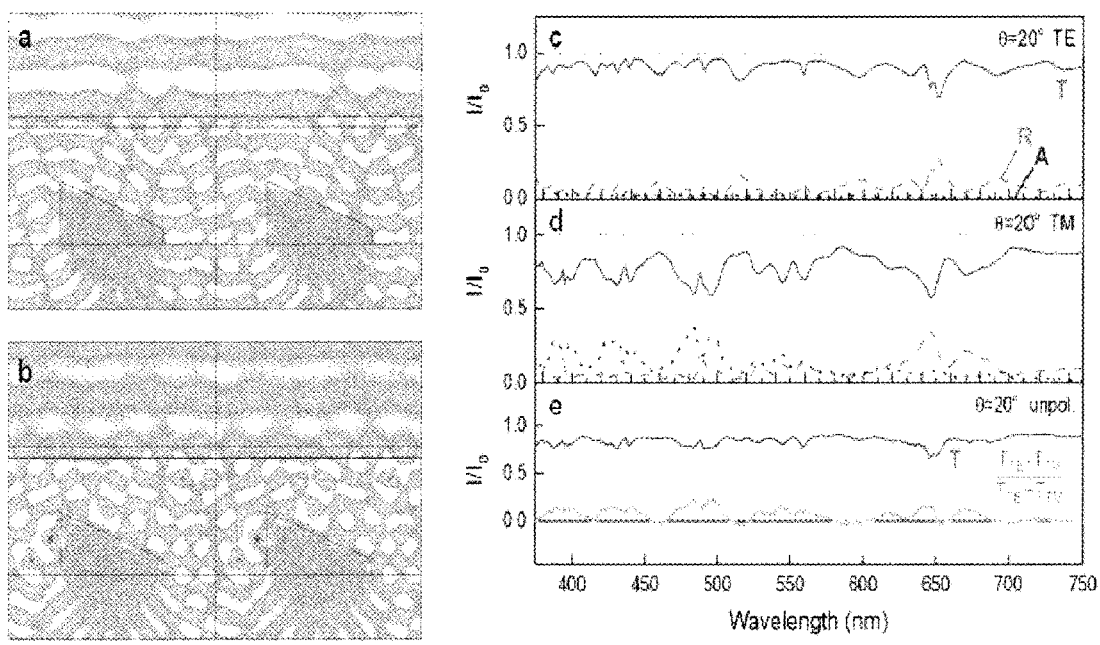
FIG. 7 shows simulated light transmission through a silver surface-shaped electrode structure: a) Electric field distribution under normal incidence TE illumination; b) magnetic field distribution under TM illumination at $\lambda=417$ nm of an interdigitated silver electrode on a substrate with refractive index n=2 embedded in an index-matched layer covered with an 88 nm thick anti-reflection coating (n=1.41) for a surface tilt of 20°, an electrode period of 2 µm and a cover layer thickness of 368 nm; c) simulated TE transmission; d) TM transmission (T), reflection (R), and absorption (A) of the electrode; and e) Transmission of unpolarized light (T) and degree of polarization (bottom line), according to illustrative aspects of the invention.

Numerical simulations were carried out to test the viability of the embodied approach in realistic electrode structures. FIG. 7a shows the electric field distribution $E_y$ under normal incidence TE illumination (electric field parallel to electrode) at λ=4 17 nm of an interdigitated silver electrode on a substrate with refractive index n=2 embedded in an index-matched layer covered with an anti-reflection coating (n=1.41, thickness 88 nm). The geometry is given by θ=20°, P=2 μm, and D=368 nm. The field pattern in the cover layer is indicative of interference between the incident plane wave and the specularly reflected wave from the electrode surface. Fields transmitted through the electrode gap show amplitude variations along the lateral direction, indicative of the superposition of the incident plane wave with the high-angle reflected beam originating from the electrode surface. FIG. 7b shows a snapshot of the magnetic field intensity $H_y$ under TM illumination at the same wavelength. Similar field patterns are observed with the exception of a fine field pattern along the electrode surfaces resulting from the excitation of surface plasmon polaritons (SPP) on the silver electrode.

FIG. 7c shows the simulated TE transmission (transmitted irradiance I divided by incident irradiance $I_0$), reflection, and absorption of the silver electrode structure. The transmission exceeds 60% for all wavelengths between 375-750 nm, and the frequency averaged transmission is 90%, close to the theoretical optimum of 100%. Many local transmission minima are observed due to diffractive effects. The TM transmission (FIG. 7d) lies above 55% for the entire wavelength range from 375 nm to 750 nm, with a frequency averaged transmission of 77%. FIG. 7e shows the transmission of unpolarized light (T line), showing a frequency averaged transmission of 84%, a factor 1.7 higher than the expected transmission of 50% based on metal areal coverage. The degree of polarization $(T_{TE}-T_{TM})/(T_{TE}+T_{TM})$ is included (bottom line) and is less than 24% across the full spectral range. These results demonstrate the polarization independence and broadband applicability of the embodied optical device.

At small electrode dimensions specular reflection is no longer well-defined as diffractive effects begin to dominate. Even in this case the electrode array can be used to direct incident radiation predominantly toward angles beyond the TIR angle by utilizing diffractive effects.

Figure 8:
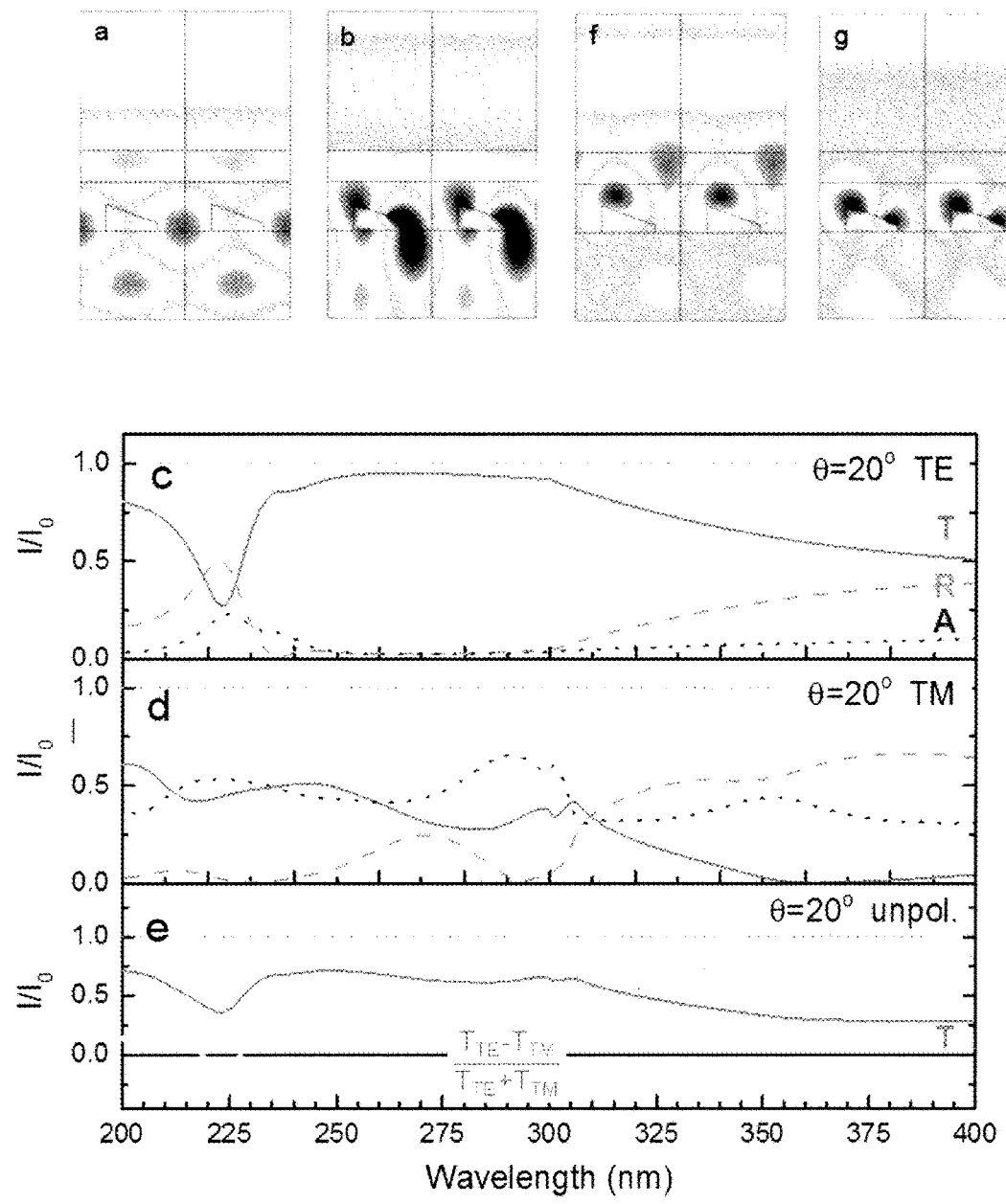
FIG. 8 shows simulated light transmission through an aluminum diffractive shaped-surface electrode structure optimized for high transmission at ultraviolet wavelengths: a) Electric field distribution under normal incidence TE illumination; (b) magnetic field distribution under TM illumination at $\lambda=250$ nm of an interdigitated rectangular aluminum electrode with a cross section of $75\times25$ nm$^2$, a periodicity of 150 nm, a cover layer thickness of 31 nm and an anti-reflection coating with index n=1.41 and thickness 44 nm; c) simulated TE transmission; d) TM transmission (solid line), reflection (dashed line), and absorption (dotted line) of the electrode; e) Transmission of unpolarized light (T line) and degree of polarization (gray line); f) Electric field distribution under normal incidence TE illumination at $\lambda=210$ nm; and, g) magnetic field distribution under TM illumination at $\lambda=330$ nm, according to illustrative aspects of the invention.

FIG. 8a shows a snapshot of the electric field distribution $E_y$ under TE illumination at λ=250 nm of a shaped-surface electrode consisting of interdigitated aluminum electrodes on a substrate with n=2 embedded in an index-matched layer covered with an anti-reflection coating (n=1.41, thickness 44 nm). The geometrical parameters are θ=20°, P=150 nm, D=31 nm, and the electrode cross-sectional area is 75×25 nm². The array is seen to generate a large field amplitude in the electrode gap, indicative of large optical transmission to the substrate.

FIG. 8b shows the $H_y$ component under TM illumination at this wavelength. In this case the electrodes are seen to support SPP standing waves, while a periodic distribution of $H_y$ is observed in the AR coating indicative of large-angle diffracted light.

FIG. 8c shows the calculated transmission, reflection, and absorption spectra of this array under TE illumination. For wavelengths between 245 nm and 300 nm, transmission larger than 90% is achieved at the chosen 50% percent Al areal coverage. A reduction of the transmission is observed at wavelengths above 300 nm, coinciding with the cutoff wavelength for diffractive effects (condition $\lambda_0 \approx n_{cov} \times P$) leading to increased reflection losses. This wavelength also corresponds to the cutoff wavelength of the 75 nm wide metal waveguide formed by the electrode gap, resulting in increased absorption for wavelengths above 300 nm. An additional transmission reduction is observed for wavelengths near 222 nm, close to the wavelength where the first (internal) diffracted order matches $\theta_{TIR}$ (condition $\lambda_0$=P). The corresponding $E_y$ distribution is shown in FIG. 8f, revealing a guided mode in the cover layer and anti-reflection coating with an anti-node in the electrode gap, leading to low transmission.

FIG. 8d shows the transmission, absorption, and reflection under TM illumination. Transmission in excess of 50% is achieved at wavelengths between ~240-250 nm.

FIG. 8g shows the $H_y$ distribution for TM illumination at the strong absorption peak at 290 nm, revealing a predominantly dipolar surface plasmon resonance on the aluminum electrode.

FIG. 8e shows the transmission spectrum of unpolarized light. The average transmission exceeds the 50% classical transmission limit from 227-320 nm, demonstrating that TIR-mediated light redirection can be used even at wavelengths and structure sizes outside the ray-optics regime.

While the examples discussed hereinabove focused on shaped electrode surfaces with a single surface tilt angle and a fixed 50% metal coverage, the metal surfaces can be shaped to optimize the transmission at even larger metal areal coverage. In addition, the phase fronts of the light reflected by the metal electrode surface may be shaped using refractive materials. The general applicability of the approach, the broadband nature of the basic operating principle and the simplicity of the design make this an advantageous approach for high-transmission electrodes on optical devices operating at wavelengths ranging from the ultraviolet to the near-infrared (e.g., 750 nm) and into the far-infrared by scaling of the structure.

It will be appreciated that the optimum electrode shape in this diffractive regime may be different from the presented tilt angle described in the preceding text.

FIG. 10 schematically illustrates the use of an effective medium approach to change the light direction in the device, an advantage being that this allows planar patterning methods. In FIG. 10, a patterned top layer is disposed over the metal electrode(s), where the patterning results in a refractive index that varies across the electrode by changing the fraction of open area. The metal itself may also be patterned to achieve the desired optical phase profile resulting in light redirection.

Figure 11:
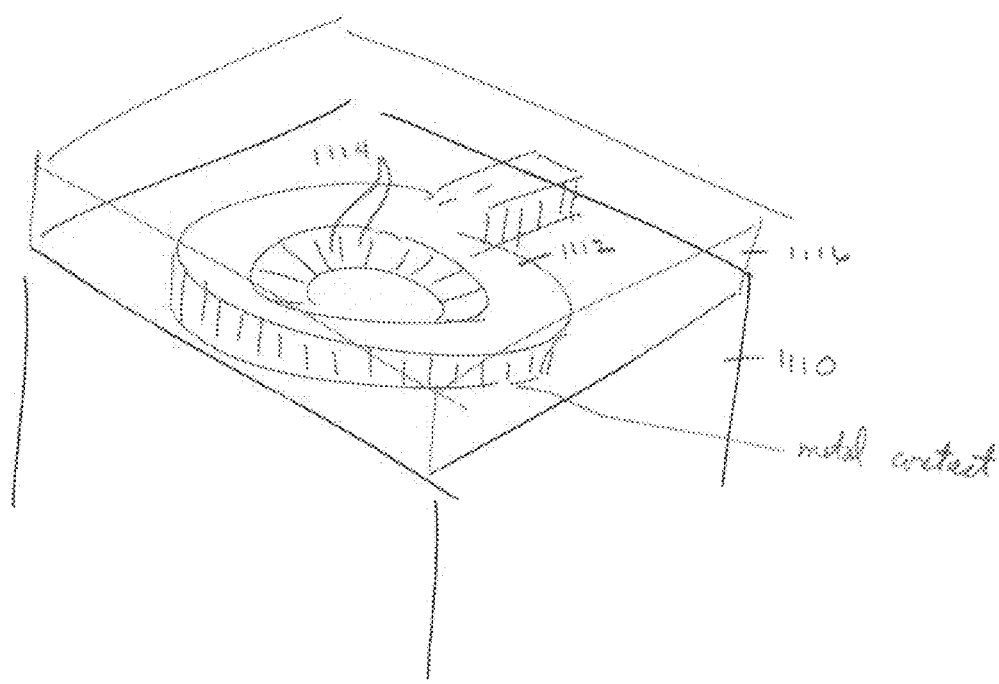
FIG. 11 schematically illustrates the optical device including an embedded shaped metallic ring contact enabling light incident on the electrode material to be transmitted to the substrate, shown in perspective view (a) and in side view (b), according to an illustrative aspect of the invention.
Figure 11:
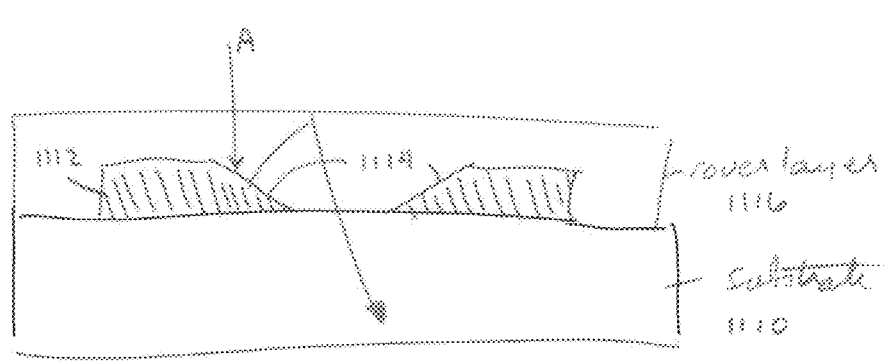

FIG. 11a schematically illustrates a perspective view of a ring electrode with shaped sidewalls embedded in an index matching cover layer, to demonstrate the use the invention in an electrode that is not composed of parallel current lines. The top layer covers and fills the metal ring electrode.

FIG. 11b shows a side view taken at the location of the vertical dashed lines in FIG. 11a, showing the shaped metal electrode (hatched regions) embedded in a cover layer. Light incident on the inclined region of the metal electrode will reflect, followed by total internal reflection at the cover layer, followed by transmission to the substrate where it can interact with the active layer. Antireflection layers can be defined both on the cover layer and at the cover-substrate interface to optimize transmission.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

I claim:

1. An optical device, comprising:
   a substrate including an active region, that is reachable by an incident light on the device, having a refractive index greater than 1;
   an electrode in operative contact with the substrate, wherein said electrode has at most two broadband, specularly-reflecting surfaces disposed to receive broadband incident light, wherein each of the at most two surfaces are inclined at a different angle with respect to a horizontal reference, such that substantially all of the broadband light incident on each surface is specularly reflected therefrom; and
   a cover layer covering at least a portion of the top surface of the substrate including the electrode, and within which cover layer the electrode is disposed,
   wherein substantially all of the broadband light incident on each of the at most two specularly-reflecting surfaces will be incident upon the cover layer and reflected therefrom at an angle, $\theta$, where $\theta$ will be sufficient for total internal reflection (TIR) of substantially all of the light from the cover layer and directed to the active region of the substrate.

2. The optical device of claim 1, wherein the cover layer is approximately index-matched with the substrate.

3. The optical device of claim 1, further comprising an incident light anti-reflection coating disposed on a top surface of the cover layer.

4. The optical device of claim 1, further comprising an anti-reflection coating disposed on or adjacent a surface of the substrate.

5. The optical device of claim 1, wherein the light-reflecting surface of the electrode is flat.

6. The optical device of claim 1, wherein the light-receiving surface of the electrode is flat and parallel to the top surface of the substrate and is covered with a material of at least one of characterized by a gradient index of refraction and a varying physical thickness.

7. The optical device of claim 1, wherein the light-receiving surface of the electrode is curved.

8. The optical device of claim 1, wherein the electrode comprises a plurality of periodically spaced electrodes.

9. The optical device of claim 1, wherein the active layer comprises a surface of the substrate.

10. The optical device of claim 1, wherein the active layer comprises an interior region of the substrate.

11. The optical device of claim 1, wherein the substrate is at least partially optically transmissive and/or absorptive.

12. The optical device of claim 1, comprising a plurality of spaced electrodes, wherein each electrode has a given width, w, and each electrode has a spacing from each adjoining electrode that is equal to the electrode width, w.

* * * * *